United States Patent [19]

Morita

[11] Patent Number: 5,336,363
[45] Date of Patent: Aug. 9, 1994

[54] LOW TEMPERATURE DRY ETCH OF COPPER

[75] Inventor: Katsumi Morita, Chiba, Japan

[73] Assignee: Applied Materials, Inc., Santa Clara, Calif.

[21] Appl. No.: 126,470

[22] Filed: Sep. 24, 1993

[51] Int. Cl.$^5$ .................... H01L 21/00; H01L 21/02; B44C 1/22; C25F 3/00
[52] U.S. Cl. .................................. 156/625; 156/646; 156/666
[58] Field of Search .................. 156/625, 646, 666

[56] References Cited

U.S. PATENT DOCUMENTS

| | | | |
|---|---|---|---|
| 3,772,100 | 11/1973 | Masuda et al. | 156/645 |
| 4,689,113 | 8/1987 | Balasubramanyam et al. | 156/646 |
| 4,734,156 | 3/1988 | Iwasa | 156/666 |
| 4,842,683 | 6/1989 | Cheng et al. | 156/345 |
| 4,951,601 | 8/1990 | Maydan et al. | 118/719 |

FOREIGN PATENT DOCUMENTS

| | | |
|---|---|---|
| 0125647 | 9/1980 | Japan . |
| 0000591 | 1/1986 | Japan . |
| 0153033 | 7/1991 | Japan . |

*Primary Examiner*—R. Bruce Breneman
*Assistant Examiner*—B. Everhart
*Attorney, Agent, or Firm*—Birgit E. Morris

[57] ABSTRACT

Copper lines can be formed on a semiconductor wafer at low temperatures by forming a patterned photoresist layer over a copper layer, and etching the copper in a vacuum etch chamber using vaporized acetic acid and water as the etchants.

5 Claims, No Drawings

LOW TEMPERATURE DRY ETCH OF COPPER

This invention relates to a process for the reactive ion etching of copper. More particularly, this invention relates to a process for etching copper by reactive ion etching using water and acetic acid as the etchants.

BACKGROUND OF THE INVENTION

In the manufacture of semiconductor devices, metal contact lines and interconnections have been made primarily of aluminum heretofore. Aluminum can be processed by dry etching in a vacuum chamber at low temperatures to form volatile by-products which can be pumped away by the chamber exhaust system. Further, aluminum has low electrical resistance. However, as the dimensions of semiconductor devices become smaller, e.g., using 0.5 micron design rules, problems with the use of aluminum have become apparent. Aluminum has low mechanical strength, and thus when it becomes stressed, as by the application of current or because of thermal cycling, aluminum tends to crack, forming disconnects. The thinner the aluminum lines become, the more this problem is exacerbated.

The use of copper as an alternative to aluminum has been studied, because copper has higher mechanical strength, is more ductile than aluminum, and has excellent conductivity. However, copper has not been used for semiconductor device manufacture up till now, because it cannot be processed by conventional dry etching equipment and processes.

In order to make line connections on a substrate, after the deposition of a conductive metal layer over the substrate, a layer of photoresist is deposited and patterned to expose portions of the metal layer. The metal layer is then etched away in the exposed areas. Aluminum has been etched by reactive ion etching using a halogen compound or an organohalide, particularly a chloride, forming aluminum chloride for example as a by-product of the reaction. This reaction takes place at temperatures below about 500° C. This low temperature etch is acceptable because it does not unduly damage a silicon wafer, or change diffused or ion implanted ions in or on the wafer used to form devices such as transistors.

However, copper does not form a corresponding copper chloride at low temperatures, but instead requires much higher temperatures of about 1000° C. at normal pressures and temperatures of over about 500° C. and up to about 600° C. under vacuum. Such temperatures have adverse effects on underlying layers and state-of-the-art photoresists can not withstand such temperatures. Thus copper cannot be used as a metal connector using state of the art semiconductor processing.

However, because of the potential advantages of the use of copper lines as enumerated above, a method of patterning copper lines at low temperatures would be highly desirable.

SUMMARY OF THE INVENTION

I have found that copper can be patterned at low temperatures, i.e., below about 500° C., using acetic acid and water as the etchant. This etchant mixture is chemically stable at room temperatures, the ingredients can be readily obtained at high purity, and they are readily vaporizable. The use of the present etchant is also advantageous because, as compared to conventional halogen etchants which are highly toxic, the present materials and their reaction products are quite safe. Further, the present etchants are not as reactive at ambient conditions of pressure and temperature, and thus attack on their containers is limited and the etchant materials do not become contaminated with the metals or other materials from their containers or processing chambers.

DETAILED DESCRIPTION OF THE INVENTION

In accordance with the present process, water and acetic acid are pre-vaporized under separate controls and the vapors separately introduced into a standard reactive ion etch chamber.

Reactive ion etch (RIE) chambers of both the parallel plate and the ECR type are well known and are suitable for use herein.

The copper coated substrate to be patterned is preferably transferred into a reactive ion etch chamber and suitably heated to about 200°-300° C. and the vaporized etchants fed to the chamber. Generally the substrate comprises a silicon wafer having a layer of an insulator thereon, a layer of copper and a patterned layer of photoresist thereover.

The use of the present chemical mixture of water and acetic acid has several advantages. Water activates the copper surface in accordance with the following equations, forming copper oxides:

1) $Cu + H_2O \rightarrow CuO + H_2$
2) $2Cu + H_2O \rightarrow Cu_2O + H_2$

The copper oxides then react with acetic acid in accordance with the following equations:

3) 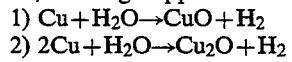 $CuO + 2CH_3COOH \rightarrow Cu(OCOCH_3)_2 + H_2O$
4) 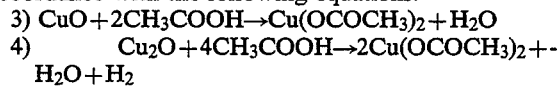 $Cu_2O + 4CH_3COOH \rightarrow 2Cu(OCOCH_3)_2 + H_2O + H_2$ Thus the final product of the above reactions is copper acetate. This compound has a low boiling point of about 240° C. and is highly volatile, so it is readily evacuated through the reactive ion etch chamber exhaust system. Other by-products are also volatile and they do not attack photoresist, any underlying insulator films or the copper lines. Further, the low processing temperature can be carried out without damaging devices on the substrate.

Since the present process can be carried out using an reactive ion etch chamber and conventional photoresists and semiconductor device processing, the only change from the processing of aluminum caused by the substitution of copper for aluminum is that a slightly higher temperature is employed. A practical etch rate is obtained without increased plasma energy requirements, thus causing less plasma damage to the substrate and devices thereon. The etchants, acetic acid and water, can be obtained at high purity and since they are stable compounds and have low toxicity at normal ambient conditions, they are less dangerous to use than the halogens employed to etch aluminum. Further, since at room temperature acetic acid is less reactive than halogens, the danger of reaction with containers and processing chambers and consequent contamination of reagents is also reduced.

In a typical process in accordance with the invention, from about 40-100 sccm of acetic acid and about 100-300 sccm of water are vaporized in independently controlled vaporizers external to an RIE chamber. The vapors are heated to about 200-400° C. Preferably the ratio of water to acetic acid passed into the chamber is about 2:1 to about 3:1 by volume, but this is not critical and the ratio can be changed as desired. The vapors are passed into the RIE chamber containing a patterned copper coated substrate, such as a semiconductor wafer, mounted therein. The chamber is evacuated to a pressure of about 10 millitorr (hereinafter mT) prior to passing etchant gases therein to degas the chamber and the substrate. The chamber pressure is maintained at about 50 mT during plasma etching, and the substrate temperature is preferably maintained at a temperature of at least 200° C. and up to about 300° C. Higher temperatures will increase the rate of etching but may cause some damage to the substrate.

A plasma RIE reactor suitable for use herein is described by Cheng et al in U.S. Pat. No. 4,842,683 which is incorporated herein by reference. Such a RIE chamber can be used as part of an automated multi-chamber system, as described by Maydan et al in U.S. Pat. No. 4,951,601, also incorporated herein by reference. For example, multiple etch chambers can be combined with preclean and photoresist strip chambers in an integrated process whereby substrates are maintained in a vacuum environment between processing steps and the transfer from one processing chamber to another is carried out in completely automated fashion.

Although the invention has been described in terms of certain reaction conditions and in certain equipment, one skilled in the art will recognize that various alternatives in equipment, reaction conditions and the like can be readily substituted which are meant to be included herein. The invention is meant only to be limited by the scope of the appended claims.

I claim:

1. A method of etching a copper layer on a substrate in a vacuum etch chamber comprising passing vaporized acetic acid and water into the chamber at a temperature of from about 200° C. and higher.

2. A method according to claim 1 wherein the temperature is from about 200° C. to 400° C.

3. A method according to claim 1 wherein the substrate is a semiconductor wafer.

4. A method according to claim 3 wherein the substrate has a layer of copper thereon and a patterned photoresist layer thereover.

5. A method according to claim 1 wherein the ratio of water to acetic acid passed into the etch chamber is from about 2:1 to about 3:1 by volume.

* * * * *